United States Patent
Wu et al.

(10) Patent No.: US 8,866,268 B2
(45) Date of Patent: Oct. 21, 2014

(54) SEMICONDUCTOR PACKAGE STRUCTURE AND MANUFACTURING METHOD THEREOF

(75) Inventors: Shang-Yi Wu, Hsinchu County (TW); Wen-Cheng Chien, Hsinchu County (TW); Chia-Lun Tsai, Hsinchu County (TW); Tien-Hao Huang, Hsinchu County (TW)

(73) Assignee: Unistars Corporation, Zhudong Township (TW)

( * ) Notice: Subject to any disclaimer, the term of this patent is extended or adjusted under 35 U.S.C. 154(b) by 399 days.

(21) Appl. No.: 13/183,446

(22) Filed: Jul. 15, 2011

(65) Prior Publication Data
US 2012/0228745 A1    Sep. 13, 2012

(30) Foreign Application Priority Data

Mar. 9, 2011    (TW) .............................. 100107826 A

(51) Int. Cl.
| | |
|---|---|
| H01L 29/41 | (2006.01) |
| H01L 21/283 | (2006.01) |
| H01L 23/367 | (2006.01) |
| H01L 33/64 | (2010.01) |
| H01L 23/00 | (2006.01) |
| H01L 33/44 | (2010.01) |
| H01L 23/13 | (2006.01) |
| H01L 23/498 | (2006.01) |
| H01L 23/31 | (2006.01) |

(52) U.S. Cl.
CPC ..... *H01L 23/3677* (2013.01); *H01L 2224/2405* (2013.01); *H01L 2224/73277* (2013.01); *H01L 2224/48091* (2013.01); *H01L 2224/24101* (2013.01); *H01L 2924/15153* (2013.01); *H01L 33/642* (2013.01); *H01L 2924/01322* (2013.01); *H01L 24/82* (2013.01); *H01L 23/13* (2013.01); *H01L 2924/141* (2013.01); *H01L 23/49816* (2013.01); *H01L 24/24* (2013.01); *H01L 23/3121* (2013.01); *H01L 2224/2401* (2013.01); *H01L 2224/73265* (2013.01); *H01L 2224/48247* (2013.01); *H01L 2224/24247* (2013.01); *H01L 2924/15311* (2013.01); *H01L 24/48* (2013.01); *H01L 2924/1434* (2013.01); *H01L 2924/1431* (2013.01); *H01L 2933/0075* (2013.01); *H01L 33/44* (2013.01)
USPC .............. 257/621; 257/431; 257/448; 257/99; 257/E29.112; 257/E21.159

(58) Field of Classification Search
CPC ...................... H01L 21/76898; H01L 2224/11; H01L 2924/15153; H01L 33/62; H01L 2224/32225
USPC .......... 257/621, E29.112, E21.159, 431–448, 257/99–100, 98, 78.103
See application file for complete search history.

(56) References Cited

U.S. PATENT DOCUMENTS

| | | | |
|---|---|---|---|
| 2007/0246724 A1 * | 10/2007 | Wen et al. ........................ | 257/98 |
| 2010/0047942 A1 * | 2/2010 | Lin et al. ........................ | 438/27 |

* cited by examiner

*Primary Examiner* — Cathy N Lam
(74) *Attorney, Agent, or Firm* — Ding Yu Tan

(57) ABSTRACT

A semiconductor package structure and a manufacturing method thereof are provided. The semiconductor package structure includes a semiconductor die, a thermally conductive film, a substrate, a plurality of electrically conductive film patterns, and at least one insulator. The thermally conductive film is disposed on the bottom of the semiconductor die. The substrate is substantially comprised of the electrically conductive material or semiconductor material. Furthermore, a first hole is disposed on and passed all the way through the substrate, and the semiconductor die is disposed in the first hole. The electrically conductive film patterns are disposed on the substrate, and not contacting with each other. In addition, the insulator is connected between the semiconductor die and the substrate.

20 Claims, 8 Drawing Sheets

US 8,866,268 B2

SEMICONDUCTOR PACKAGE STRUCTURE AND MANUFACTURING METHOD THEREOF

FIELD OF INVENTION

The invention relates to a semiconductor package structure, especially relates to a semiconductor package structure having improved heat dissipation efficiency.

BACKGROUND OF THE INVENTION

With the rapid technological development in recent years, the luminous efficiency and the brightness of the light emitting diode is accepted by the public, so that the light emitting diode is used widely for example in backlight assembly, car lamp, and street light, etc. However, with the increasing brightness, the larger amount of heat emission from the light emitting diode has become a troublesome issue in the industry. If the heat emission cannot be removed efficiently, the brightness of the light emitting diode will be decreased and the corresponding service life will become shorter.

Please refer to FIG. 1. FIG. 1 shows a front view of a traditional LED device assembly 100. The conventional LED device assembly 100 is disposed on a circuit board 10. The LED device assembly 100 includes a light emitting diode 110, a substrate 120, a reflector 130, and an insulator 140. The substrate 120 is a MCPCB (Metal Core PCB) substrate. The light emitting diode 110 and the reflector 130 are both disposed on the substrate 120. The reflector 130 defines a cup-shaped cavity 132. The light emitting diode 110 is disposed in the cavity 132. The light emitting diode 110 is joined to the substrate 120 by a conductive paste 102. The side wall of the cavity 132 has a relatively smooth reflective surface and is able to reflect the light emitting from the light emitting diode 110, so that the directivity of the light is improved.

However, the reflector 130 and the substrate 120 are of two different elements, so that after an extended usage period, the reflector 130 may be dislocated or separated from the substrate 120. The heat emitted from the light emitting diode 110 is transferred to the outside environment via the substrate 120 and the circuit board 10; for this reason, the heat dissipation efficiency of the light emitting diode 110 is dependent on the thickness of the substrate 120. Therefore, the heat dissipation efficiency of the LED device assembly 100 is decreased as the thickness of the substrate 120 is increased. However, the mechanical strength of the LED device assembly 100 will be weakened if the thickness of the substrate becomes thinner. The conductive paste which can be used, can be for example such as a silver paste, and the silver paste includes polymer material and other materials having inferior thermal conductivity so that the heat emitted from the light emitting diode 110 cannot be dissipated efficiently. In recent years, a technical solution offered by replacing the silver paste with an eutectic structure, for example: Au—Sn eutectic structure, is provided. However, this technical solution has the disadvantages of added process complexity and higher cost.

Hence, there is a need in the art for improving the heat dissipation efficiency of the LED device assembly 100.

SUMMARY OF THE INVENTION

One aspect of the invention is to provide a semiconductor package structure and a manufacturing method thereof. The semiconductor package structure has improved heat dissipation efficiency and suitable mechanical strength.

To achieve the foregoing and other aspects, a semiconductor package structure is provided. The semiconductor package structure includes a semiconductor die, a thermally conductive film, a substrate, a plurality of conductive patterns, and at least one insulator. The thermally conductive film is disposed on the bottom of the semiconductor die. The substrate is substantially comprised of conductive material or semiconductor material. A first hole is formed on and passed all the way through the substrate. The semiconductor die is disposed in the first hole. The conductive patterns are disposed on the substrate and the conductive patterns are not electrically connected to each other. The conductive patterns are not electrically connected to the substrate. The insulator is connected between the semiconductor die and the substrate. Furthermore, the semiconductor die is for example, a light emitting diode. Or, the semiconductor die can also be a laser diode, a photodiode, a logic IC, a memory IC, an analogical IC, or a CMOS image sensor.

In the semiconductor package structure, a plurality of insulating film patterns is disposed. The conductive patterns are a plurality of conductive film patterns and the conductive film patterns are disposed on the surface of the substrate. The insulating film patterns are disposed between the conductive film patterns and the substrate.

In the semiconductor package structure, a plurality of second holes is formed on the substrate. The conductive film pattern and the insulating film pattern are disposed on the surface of the second hole.

In the semiconductor package structure, the conductive film pattern and the insulating film pattern are disposed on the side wall of the substrate.

In the semiconductor package structure, a plurality of second holes is formed on the substrate. The conductive patterns include a plurality of conductive bars, and the conductive bars are disposed in the second holes. The quantity of the insulators is numerous, and the insulators are connected between the semiconductor die and the substrate, and between the substrate and the conductive bars, respectively.

In the semiconductor package structure, the material of the insulator is polyimide, solder resist, or a permanent photo resist.

In the semiconductor package structure, a metal reflective layer is disposed on the side wall of the first hole.

In the semiconductor package structure, the substrate is substantially comprised of copper, aluminum, or an alloy comprising at least one of copper and aluminum.

In the semiconductor package structure, the conductive patterns are substantially comprised of copper, nickel, aurum, silver, or an alloy comprising at least one of copper, aurum, and silver.

To achieve the foregoing and other aspects, a manufacturing method of a semiconductor package structure is provided and includes the following steps. First, a substrate substantially comprised of a conductive material or a semiconducting material is provided. A first hole is formed on the substrate, and the first hole is passed all the way through the substrate. Then, a semiconductor die is disposed in the first hole. Thereafter, an insulator is coated between the semiconductor die and the substrate. Afterward, a plurality of conductive patterns is disposed, and the conductive patterns are not electrically connected to each other. At a later time, a thermally conductive film is disposed on the bottom of the semiconductor die. Then, the semiconductor die is electrically connected to the conductive patterns.

In the manufacturing method of the semiconductor package structure, the semiconductor die is a light emitting diode, a laser diode, a photodiode, a logic IC, a memory IC, an analogical IC, or a CMOS image sensor.

In the manufacturing method of the semiconductor package structure, the substrate further includes a plurality of second holes. Before the step (b), a plurality of insulating film patterns is disposed on the surfaces of the substrate and the second hole. In the step (d), the conductive patterns are a plurality of conductive film patterns, and the conductive film patterns are disposed on the insulating film patterns.

In the manufacturing method of the semiconductor package structure, the insulating film patterns are formed by using an electrochemical plating method, an electrophoresis method, or an electrochemical deposition method.

In the manufacturing method of the semiconductor package structure, the conductive film patterns and the thermally conductive film are formed at the same time.

In the manufacturing method of the semiconductor package structure, before the step (b) a plurality of insulating film patterns is disposed on the top surface, the bottom surface, and the side walls of the substrate. In the step (d), the conductive patterns are a plurality of conductive film patterns, and the conductive film patterns are disposed on the insulating film patterns.

In the manufacturing method of the semiconductor package structure, the substrate includes a plurality of second holes and a plurality of conductive bars, and in the step (d), the conductive bars are disposed in the second holes to form the conductive patterns. The thicknesses of the conductive bars are approximately equal to the depths of the second holes, respectively. Furthermore, the manufacturing method further includes the step of forming a plurality of conductive film patterns on the conductive bars.

The manufacturing method of the semiconductor package structure further includes the step of forming a metal reflective layer on the side wall of the first hole.

In the manufacturing method of the semiconductor package structure, the thickness of the semiconductor die is approximately equal to the depth of the first hole.

In the manufacturing method of the semiconductor package structure, before the step (b) the substrate is reversed or flipped over to make the bottom of the substrate facing up. Between the step (e) and the step (f), the substrate is reversed or flipped over again to make the bottom of the substrate facing down.

Because the heat emitted from the semiconductor die can be dissipated to the outside environment via the thermally conductive film directly, the semiconductor package structure of the invention has better heat dissipation efficiency.

DETAILED DESCRIPTION OF THE INVENTION

In the following description, the conductive film patterns are the embodiment of the conductive patterns in the first, third, and fifth embodiments of the present invention. The conductive bars are the embodiment of the conductive patterns in the second and fourth embodiments of the present invention.

Figure 2:
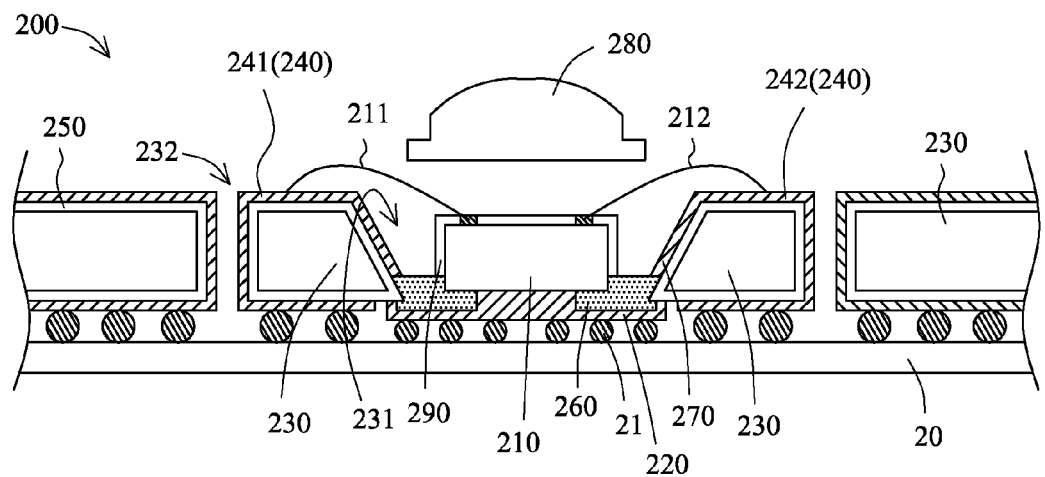
FIG. 2 shows a first embodiment of the LED device assembly in the present invention.

Please refer to FIG. 2 in which a first embodiment of the LED device assembly in the present invention is shown. The LED device assembly 200 includes a light emitting diode 210, a thermally conductive film 220, a substrate 230, a plurality of conductive film patterns 240, a plurality of insulating film patterns 250, and at least one insulator 260. The thermally conductive film 220 is disposed on the bottom of the light emitting diode 210. The substrate 230 is substantially comprised of copper. A first hole 231 and a plurality of second holes 232 are disposed on the substrate 230. The first hole 231 and the second holes 232 are passed all the way through the substrate 230. The light emitting diode 210 is disposed in the first hole 231. The conductive film patterns 240 are disposed on the top surface and the bottom surface of the substrate 230, and on the side walls of the second holes 232. The thicknesses of the conductive film patterns 240 are preferably larger than 10 μm. The conductive film patterns 240 includes a first conductive film pattern 241 and a second conductive film pattern 242. The first conductive film pattern 241 is not contacted with the second conductive film pattern 242. In this embodiment, the conductive film pattern 240 on the top surface of the substrate 230 is electrically connected to the conductive film pattern 240 on the bottom surface of the substrate 230 via the conductive film patterns 240 in the second holes 232.

The insulating film patterns 250 are disposed between the conductive film patterns 240 and the substrate 230. The insulator 260 is connected between the light emitting diode 210 and the substrate 230. The light emitting diode 210 and the substrate 230 are connected by using the insulator 260. In the embodiment, the material of the insulator 260 is solder resist, polyimide, or a permanent photoresist. A person skilled in the art can select other insulating material which is suitable in the print coating process for use as the material of the insulator 260. The thickness of the insulator 260 is controlled so as to be consistent and compatible with the thickness ranges of the light emitting diode 210, which is preferably between 30 μm and 100 μm, and thus the light emitting diode 210 can be sufficiently supported by the insulator 260.

A first wire 211 and a second wire 212 are connected with the light emitting diode 210. The first wire 211 is connected between the negative electrode of the light emitting diode 210 and the first conductive film pattern 241. The second wire 212 is connected between the positive electrode of the light emitting diode 210 and the second conductive film pattern 242. A luminescent layer 290 is coated on the light emitting diode 210. The illuminating color of the LED device assembly 200 is determined based on the material characteristics of the luminescent layer 290. A metal reflective layer 270 is disposed on the side wall of the first hole 231, and is used to reflect the light emitted from the light emitting diode 210. In this embodiment, the metal reflective layer 270 is a part of the conductive film patterns 240. A left portion of the metal reflective layer 270 is a part of the first conductive film pattern 241 and a right portion of the metal reflective layer 270 is a part of the second conductive film pattern 242. Furthermore, a lens 280 is disposed in the LED device assembly 200. A plurality of beams of light will be collected by the metal reflective layer 270 and the lens 280.

In this embodiment, the primary materials of the thermally conductive film 220, the conductive film patterns 240, or the metal reflective layer 270 are copper. Besides copper, the material of the conductive film pattern 240 includes nickel, aurum, silver, or an alloy comprising at least one of nickel, aurum, and silver, so as to enhance the physical characteristics of the conductive film patterns 240. The LED device assembly 200 is disposed on a circuit board 20. The LED device assembly 200 is electrically connected to the circuit board 20 by using surface mount technology.

Figure 1:
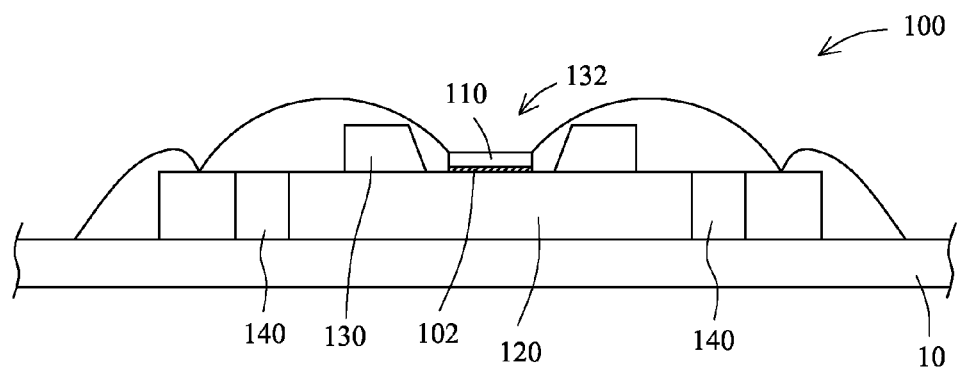
FIG. 1 shows a front view of a traditional LED device assembly 100.

In FIG. 1, the light emitting diode 110 is fixed on the substrate 120 by using the conductive paste 102. The heat generated from the light emitting diode 110 must be first passed through the conductive paste 102, which is disposed on the bottom of the light emitting diode 110, then passed through the substrate 120 and the solder 11 which is disposed under the substrate 120, and finally dissipated to the circuit board 10. In FIG. 2, the light emitting diode 210 is fixed by the insulator 260 and the thermally conductive film 220, thus the conductive paste is not needed. Therefore, the heat generated from the light emitting diode 210 is dissipated into the circuit board 20 via the thermally conductive film 220 and the solder 21 which is disposed under the thermally conductive film 220. Compared to the light emitting diode 110 in FIG. 1, because of eliminating the dissipating process for the conductive paste, the heat generated from the light emitting diode 210 is dissipated into the circuit board 20 more quickly. Furthermore, the cost is reduced because the conductive paste is not needed. By comparing FIG. 1 and FIG. 2, the thickness of the thermally conductive film 220 is less than that of the substrate 120, so that the LED device assembly 200 has better heat dissipation efficiency than the LED device assembly 100. Because the metal reflective layer 270 is disposed in the first hole 231 of the substrate 230, the problem directed to the dislocation or separation between the reflector 130 and the substrate 120 of the LED device package assembly 100 in FIG. 1 will not be encountered in the LED device package assembly 200. Because the substrate 230 has a suitable or adequate thickness, the LED device package assembly 200 thereby has a suitable or adequate mechanical strength.

Please refer to FIG. 3A~FIG. 3G in which the manufacturing process of the LED device assembly in FIG. 2 is shown. Please refer to FIG. 3A, the substrate 230 in which the first hole 231 and the second holes 232 are formed is provided. Then please refer to FIG. 3B, the insulating film patterns 250 are formed on the substrate 230. In the embodiment, the insulating film patterns 250 are formed by using an electrochemical plating method, an electrophoresis method, or an electrochemical deposition method. The electrochemical plating method, the electrophoresis method, or the electrochemical deposition method is utilized to apply a voltage on the substrate 230 and make the substrate 230 to be positively or negatively charged, so that a plurality of particles or ions having opposite charges are deposited on the substrate 230. Compared with the conventional methods of 1) sputtering deposition method, 2) the anodic oxidation method, or 3) thermal oxidation method, the electrochemical plating method, the electrophoresis method, or the electrochemical deposition method used in the manufacturing method of this embodiment has higher deposition rate, and can deposit a thicker insulating film pattern 250 in a shorter time. In this embodiment, the insulating film pattern 250 thickness is larger than 2 µm, and is preferably larger than 5 µm. Because the insulating film pattern 250 has larger thickness, the dielectric breakdown is not as easy to occur. In this embodiment, the material of the insulating film 250 is a polymer, for example: epoxy resin, silicone, polyimide, or solder mask. Thereafter, please refer to FIG. 3C, the substrate 230 is reversed or flipped over so as to make the bottom of the substrate 230 facing up. At this time, the substrate 230 is supported by a supporting frame (not shown). In addition, the substrate 230 can be further fastened by a high temperature resistant tape. Afterwards, please refer to FIG. 3D, the light emitting diode 210 is disposed in the first hole 231 by going through the bottom of the first hole 231. In this embodiment, the thickness of the light emitting diode 210 is approximately equal to the depth of the first hole 231. Therefore, the bottom of the light emitting diode 210 and the bottom of the substrate 230 are configured or arranged at the same height after the light emitting diode 210 is being disposed in the first hole 231.

Figure 3A:
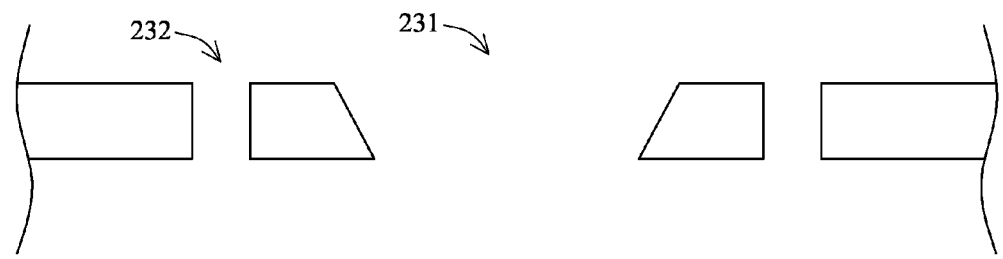
FIG. 3A~FIG. 3G shows the manufacturing process of the LED device assembly shown in FIG. 2.
Figure 3B:
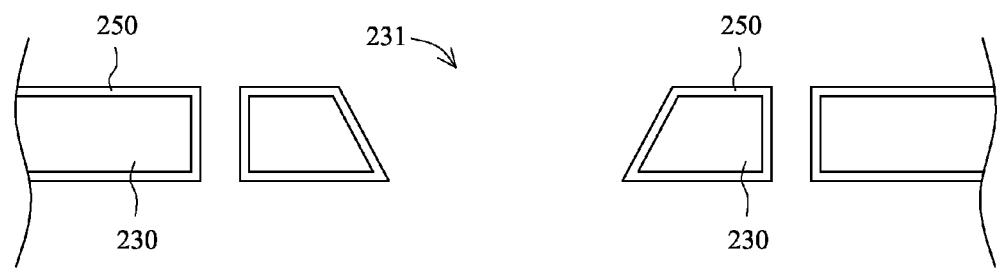
Figure 3C:
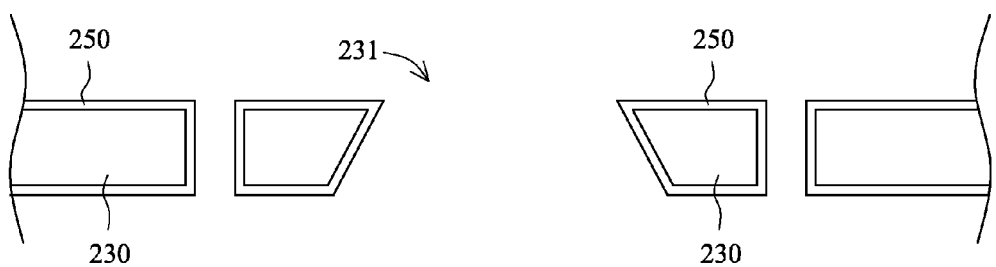
Figure 3D:
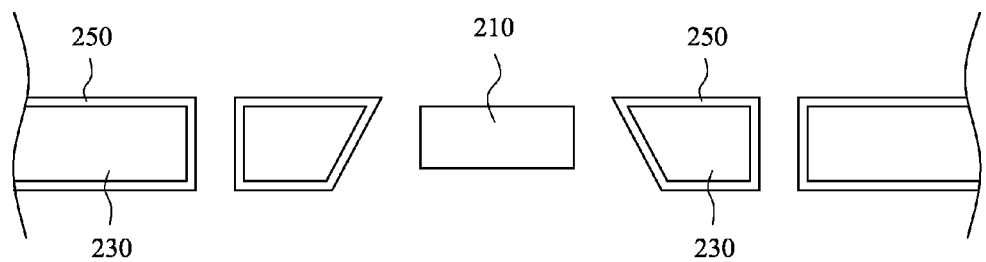
Figure 3E:
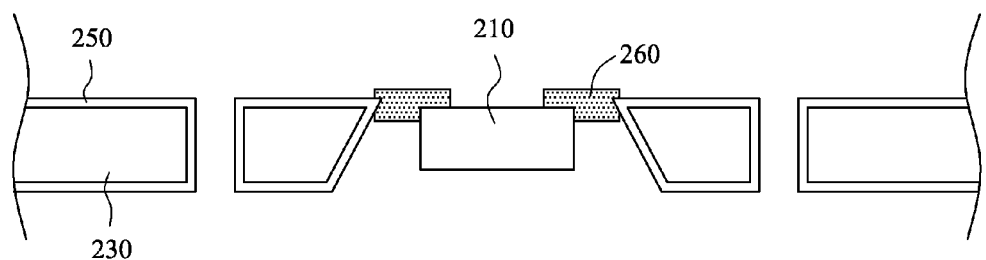
Figure 3F:
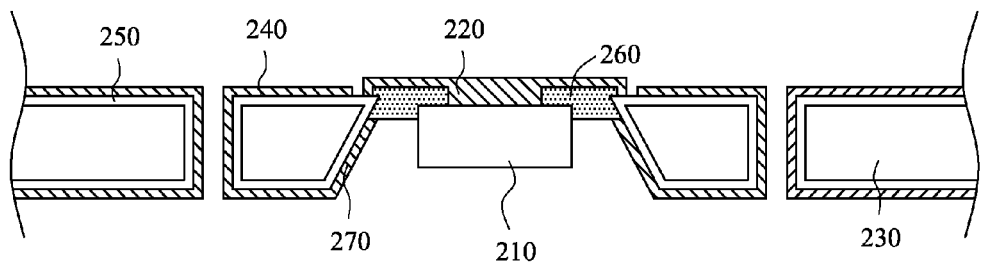

Then, please refer to FIG. 3E, the insulator 260 is coated between the light emitting diode 210 and the substrate 230 by using the method of screen printing, hot press forming, photolithography process, or vacuum lamination. By doing this, the light emitting diode 210 can be preliminarily supported and fastened. Then please refer to FIG. 3F, by using the electrochemical plating method and the electrophoresis method, the thermally conductive film 220, the conductive film pattern 240, the metal reflective layer 270 are disposed on the substrate 230. After the thermally conductive film 220 is disposed, the light emitting diode 210 is fastened by the insulator 260 and the conductive film pattern 220. In this embodiment, the thermally conductive film 220 and conductive film patterns 240 are formed at the same time. However, the thermally conductive film 220 and conductive film patterns 240 can be formed separately. The material of the thermally conductive film 220 is identical to the material of the conductive film patterns 240, so that the cost is reduced efficiently.

Figure 3G:
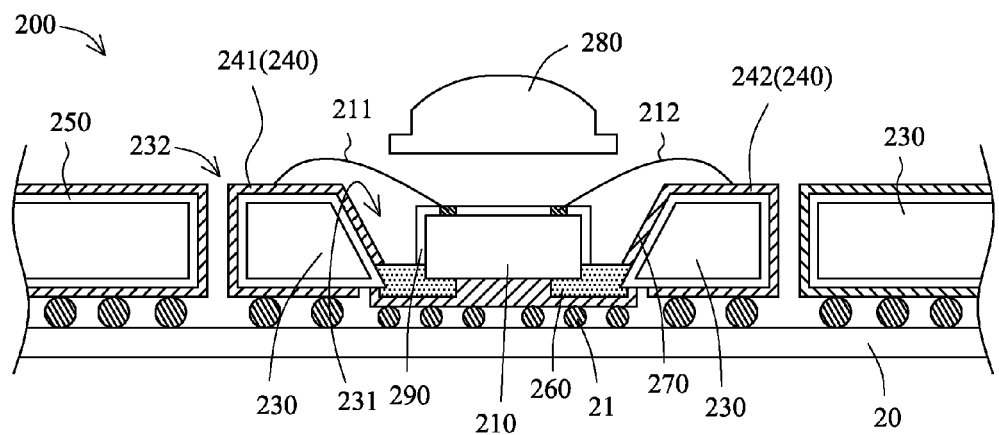

Thereafter, please refer to FIG. 3G The substrate 230 is reversed again to make the bottom of the substrate 230 facing down. Then, the semiconductor die 210 is electrically connected to the conductive film patterns 240. Namely, the first wire 211 is connected between the positive electrode of the light emitting diode 210 and the first conductive film pattern 241, and the second wire 212 is connected between the negative electrode of the light emitting diode 210 and the second conductive film pattern 242. Furthermore, the luminescent layer 290 is coated on the light emitting diode 210. Afterwards, the lens 280 is mounted above the light emitting diode 210, and the LED device assembly 200 is mounted on the circuit board 20 by using the surface mounted technology. At this time, the LED device assembly 200 shown in FIG. 2 is formed.

In the above embodiment, the person of ordinary skill in the art would be reversing or flipping over the substrate 230 for the sake of making it more convenient for subsequent coating of the insulator 260, however, those skilled in the art would also chose to not reverse or flip over the substrate 230 based upon particular specific desired requirements and conditions.

Figure 4:
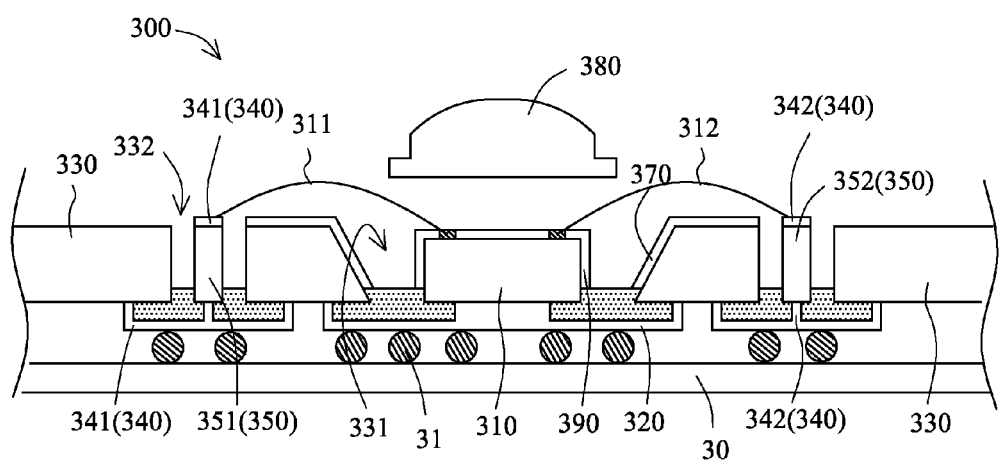
FIG. 4 shows the second embodiment of the LED device assembly in the present invention.

Please refer to FIG. 4 in which the second embodiment of the LED device assembly is shown. The LED device assembly 300 includes a light emitting diode 310, a thermally conductive film 320, a substrate 330, a plurality of conductive film patterns 340, a plurality of conductive bars 350, and a plurality of insulators 360. The thermally conductive film 320 is disposed on the bottom surface of the light emitting diode 310. The substrate 330 is substantially comprised of copper. A first hole 331 and a plurality of second holes 332 are formed on the substrate. The first hole 331 and the second holes 332 are passed all the way through the substrate 330. The light emitting diode 310 is disposed in the first hole 331, and the conductive bars 350 are disposed in the second holes 332. In this embodiment, the conductive bars 350 includes a first conductive bar 351 and a second conductive bar 352. The first conductive bar 351 and the second conductive bar 352 are disposed in different second holes 332, respectively. The conductive film patterns 340 includes a first conductive film pattern 341 and a second conductive film pattern 342. The first conductive film pattern 341 and the second conductive film pattern 342 are disposed on the top surface and bottom surface of the first conductive bar 351 and the second conductive bar 352, respectively. A first wire 311 and a second wire 312 are connected with the light emitting diode 310. The first wire 311 is connected between the positive electrode of the light emitting diode 310 and the first conductive film pattern 341. The second wire 312 is connected between the negative electrode of the light emitting diode 310 and the second conductive film pattern 342. A luminescent layer 390 is coated on the light emitting diode 310. The illuminating color of the LED device assembly 300 is determined based on the material characteristics of the luminescent layer 390. In this embodiment, the first conductive bar 351 and the second conductive bar 352 are not electrically connected to the substrate 330.

In the first embodiment, the conductive film pattern 240 on the top surface of the substrate 230 is electrically connected to the conductive film pattern 240 on the bottom surface of the substrate 230 via the conductive film patterns 240 in the second holes 232. In the third embodiment, the conductive film pattern 340 on the top surface of the substrate 330 is electrically connected to the conductive film pattern 340 on the bottom surface of the substrate 330 via the conductive bars 350. Thus, unlike the LED device assembly 200 shown in the first embodiment, the insulating film pattern of the second embodiment is not disposed in the LED device assembly 300.

In the second embodiment, the heat generated from the light emitting diode 310 can be dissipated into the circuit board 30 via the thermally conductive film 320 and the solder 31 which is disposed under the thermally conductive film 320. Compared with the LED device assembly 100, the LED device assembly 300 has better heat dissipation efficiency.

In the first embodiment and the second embodiment, the primary material of the substrates 230, 330 is copper, but a person skilled in the art can use other conductive material, for example: aluminum, as the primary or main material of the substrates 230, 330. A semiconductor material such as silicon can also be used as the primary material of the substrates 230, 330. The substrates 230, 330 can also be the ceramic substrates or PCB substrates. Furthermore, a person skilled in the art can select to opt out or forego of having the metal reflective layers 270, 370 on the substrates 230, 330.

Please refer to FIG. 5A~FIG. 5F in which the manufacturing process of the LED device assembly in FIG. 4 is shown. First, please refer to FIG. 5A, the substrate 330 in which the first hole 331 and the second holes 332 are formed is provided. Thereafter, please refer to FIG. 5B, the substrate 330 is reversed or flipped over so as to make the bottom of the substrate 330 facing up. At this time, the substrate 330 is supported by a supporting frame (not shown). In addition, the substrate 330 can be further fastened by a high temperature resistant tape. Then please refer to FIG. 5C, the light emitting diode 310 is disposed in the first hole 331 by going through the bottom of the first hole 331, and the conductive bars 350 are disposed in the second holes 332 by going through the bottoms of the second holes 332. In this embodiment, the thickness of the light emitting diode 310 and the thickness of the conductive bars 350 are each approximately equal to the thickness of the substrate 330. In other words, after the light emitting diode 310 and the conductive bars 350 are disposed in the first hole 331 and the second hole 332, respectively, their bottoms and the bottom of the substrate 330 are disposed or configured at the same height. Afterwards, please refer to FIG. 5D, the insulators 360 are coated between the light emitting diode 310 and the substrate 330 and between the conductive bars 350 and the substrate 330, respectively, by using the method of screen printing, hot press forming, photolithography process, or vacuum lamination. Thereafter, the thermally conductive film 320, the conductive film pattern 340, and the metal reflective layer 370 are disposed on the substrate 330.

Figure 5A:
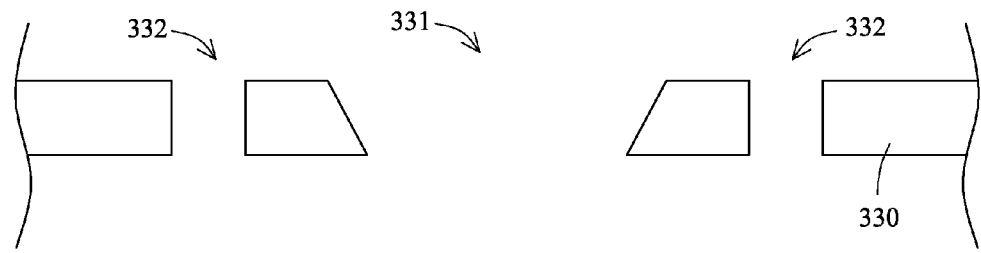
FIG. 5A~FIG. 5F shows the manufacturing process of the LED device assembly shown in FIG. 4.
Figure 5B:
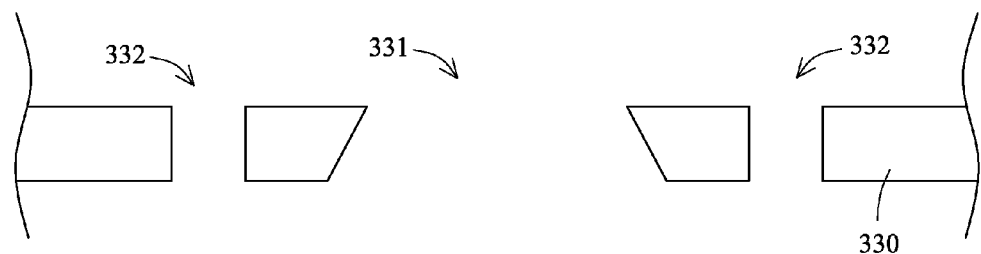
Figure 5C:
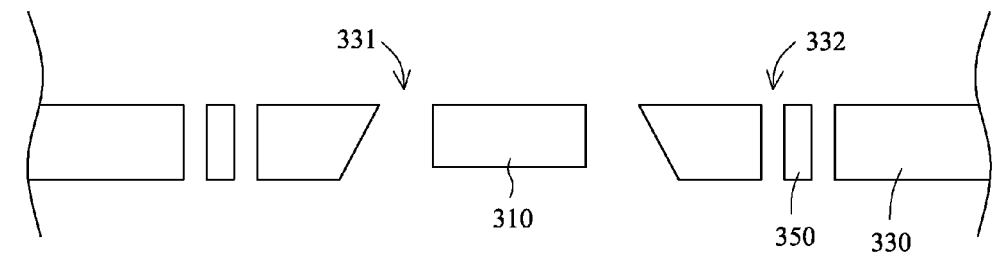
Figure 5D:
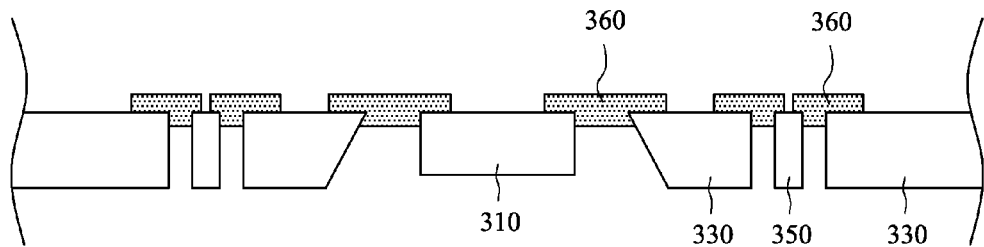
Figure 5E:
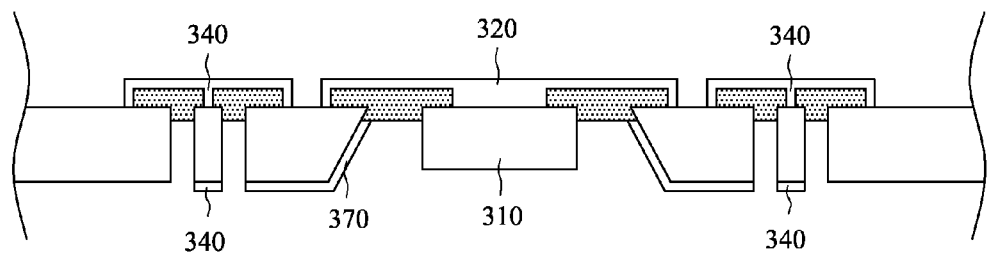
Figure 5F:
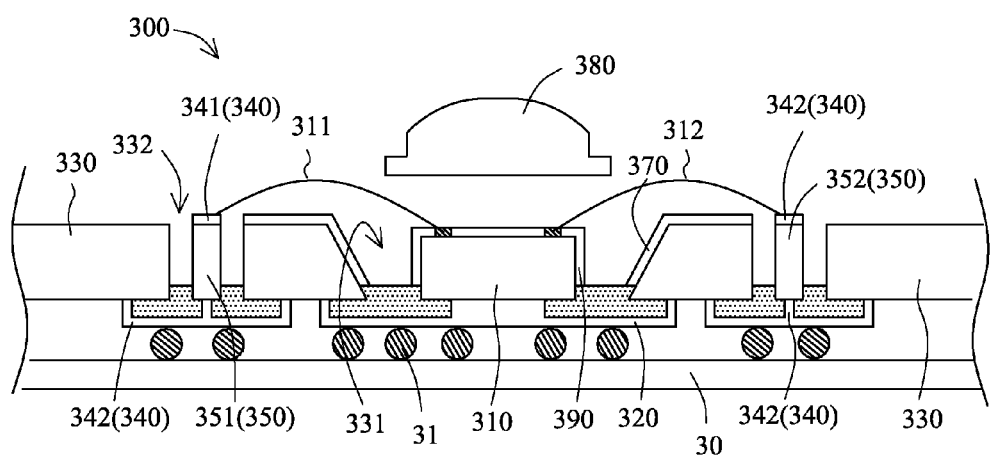

Please refer to FIG. 5F. The substrate 330 is reversed or flipped over so as to make the bottom of the substrate 330 facing down. Then the semiconductor die 310 and the conductive film patterns 340 are electrically connected to each other, i.e. the first wire 311 and the second wire 312 are connected to the positive electrode and negative electrode of the light emitting diode 310, respectively. Furthermore, the luminescent layer 390 is coated on the light emitting diode 310. Afterwards, the lens 380 is mounted above the light emitting diode 310, and the LED device assembly 300 is mounted on the circuit board 30 by using the surface mounted technology. At this time, the LED device assembly 300 shown in FIG. 4 is formed.

In the manufacturing processes of the first embodiment and the second embodiment, the substrates 230, 330 are reversed or flipped over so as to coat the insulators 260, 360 conveniently. However, a person skilled in the art can chose instead not to reverse the substrates 230, 330. The figures shown in first embodiment and the second embodiment only show the manufacturing process of single LED device assembly. However, a person skilled in the art should appreciate and understand that in the described manufacturing process, a plurality of LED devices assemblies are being manufactured at the same time, i.e. that is, the wafer level package is thereby adopted, so as to increase the production efficiency. In this wafer level package process, if the thicknesses of the light emitting diodes 210, 310 are each equal to the depths of the first holes 231, 331 respectively, and the thicknesses of the conductive bars 350 are equal to the depths of the second holes 332, the rate of production will be increased. However, the thicknesses of the light emitting diodes 210, 310 are not needed to be equal to the depths of the first holes 231, 331, and the thicknesses of the conductive bars 350 are not needed to be equal to the depths of the second holes 332.

In the first embodiment, the light emitting diode 210 is electrically connected to the first conductive film pattern 241 and the second conductive film pattern 242 by the wire bonding method. In the second embodiment, the light emitting diode 310 is electrically connected to the first conductive bars 351 and the second conductive bars 352 by the wire bonding method. However, the light emitting diode can be electrically connected to other electronic components by also other connecting methods, instead of being limited to wire bonding method.

Figure 6:
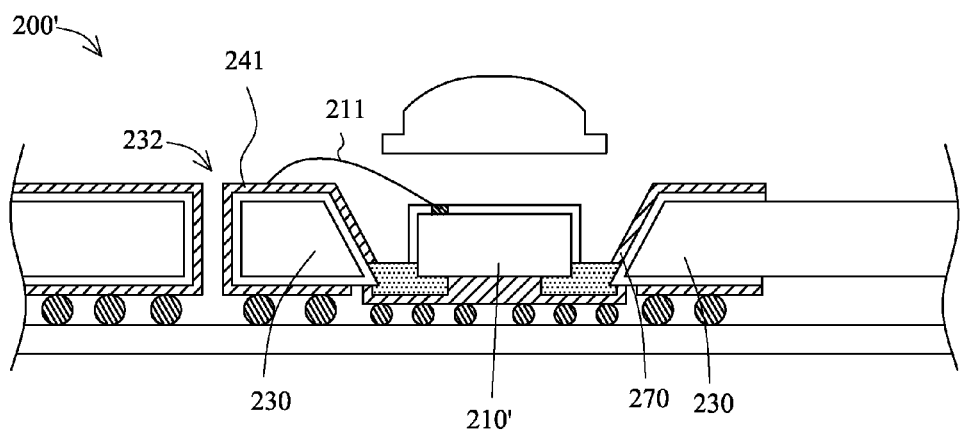
FIG. 6 shows a third embodiment of the LED device assembly in the present invention.

Please refer to FIG. 6 in which a third embodiment of the LED device assembly is shown. In this embodiment, the negative electrode of the light emitting diode 210' is electrically connected to the first conductive film pattern 241 by wire bonding method. The positive electrode of the light emitting diode 210' is in the bottom of the light emitting diode 210', and contacted with the thermally conductive film 220 directly. Furthermore, the thermal conductive film 220 is not electrically connected to the first conductive film pattern 241. The thermally conductive film 220 possess the electrical conductive effect or properties, so that the second conductive film pattern is not needed to be disposed on the substrate 230, and the first hole 231 is only formed on the side of the substrate 230 on which the first conductive film pattern 241 is coated.

Figure 7:
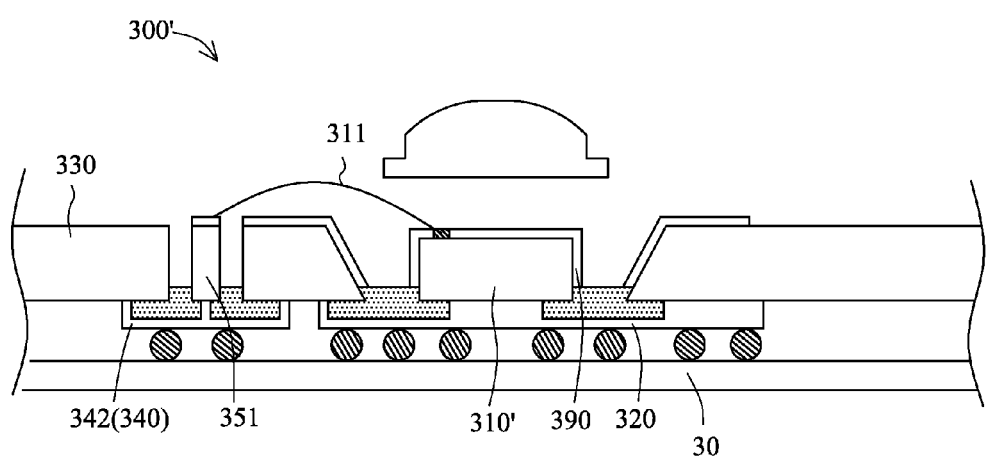
FIG. 7 shows a fourth embodiment of the LED device assembly in the present invention

Please refer to FIG. 7 in which a fourth embodiment of the LED device assembly in the present invention is shown. In this embodiment, the negative electrode of the light emitting diode 310' is electrically connected to the first conductive bar 351 by the wire bonding method, and the positive electrode of the light emitting diode 310' is directly contacted to the thermally conductive film 320. In other words, in this embodiment, the negative electrode and positive electrode of the light emitting diode 310' are disposed on the top side and the bottom side of the light emitting diode 310', respectively. In addition, the first conductive bars 351 are not electrically connected to the substrate 330. The thermally conductive film 320 in this embodiment has also electrical conductive property besides of thermal conductive property, so that the second conductive bar is not needed to be disposed.

Figure 8:
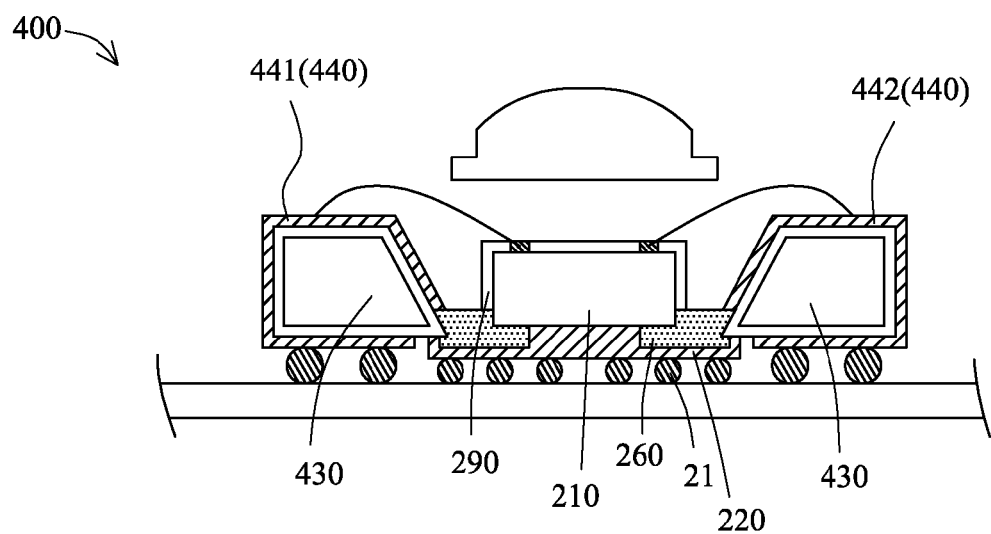
FIG. 8 shows a fifth embodiment of the LED device assembly in the present invention.

Please refer to FIG. 8, in which a fifth embodiment of the LED device assembly in the present invention is shown. Compared to the LED device assembly 200 shown in FIG. 2, the second hole is not formed on the substrate 430 of the LED device assembly 400. The first conductive film pattern 441 and the second conductive film pattern 442 are disposed not only on the top surface and the bottom surface of the substrate 430 but also on the side walls of the substrate 430. Therefore, the conductive film pattern 440 on the top surface of the substrate 430 is electrically connected to the conductive film pattern 440 on the bottom surface via the conductive film patterns 440 on the side walls.

In the above described embodiments, only a single light emitting diode is disposed in the LED device assembly. However, a person skilled in the art can also select to use additional number of light emitting diodes, and connect them in parallel.

Furthermore, the LED device assemblies described in the above embodiments is only one example of the type of the semiconductor package structures that can be used, and such package structures can also be adapted for usage in other kinds of the semiconductor package structure, so as to increase the heat dissipation efficiency. In other words, the light emitting diodes in the above disclosure can be replaced by other types of the semiconductor dies, for example: a laser diode, a photodiode, a logic IC, a memory IC, an analogical IC, or a CMOS image sensor. The quantity of the conductive film patterns is varied according to the type of the mounted semiconductor die, and mainly depending on the number of pins of the semiconductor die. For example, if the number of pins is a total of ten, the corresponding number of the conductive film will also be ten.

Although the description above contains many specifics, these are merely provided to illustrate the invention and should not be construed as limitations of the invention's scope. Thus it will be apparent to those skilled, in the art that various modifications and variations can be made in the system and processes of the present invention without departing from the spirit or scope of the invention.

What is claimed is:

1. A semiconductor package structure, comprising:
    a semiconductor die;
    a thermally conductive film, the thermally conductive film disposed on the bottom of the semiconductor die;
    a substrate, the substrate substantially comprised of a conductive material or semiconductor material, a first hole formed on the substrate, the first hole passed through the substrate, and the semiconductor die disposed in the first hole;
    a plurality of conductive patterns, the conductive patterns disposed on the substrate, the conductive patterns not electrically connected to each other, and the conductive patterns not electrically connected to the substrate; and
    at least one insulator, the insulator connected between the semiconductor die and the substrate;
    wherein the semiconductor die is electrically connected to the conductive patterns, the thermally conductive film has a protruding center region disposed under a bottom portion of the semiconductor die and a plurality of bending up end corners, the semiconductor die is fixed by the insulator and the thermally conductive film, and the thickness of the insulator is controlled so as to support the semiconductor die.

2. The semiconductor package structure of claim 1, further comprising a plurality of insulating film patterns, wherein the conductive patterns are a plurality of conductive film patterns, the conductive film patterns are disposed on a surface of the substrate, and the insulating film patterns are disposed between the conductive film patterns and the substrate.

3. The semiconductor package structure of claim 2, wherein a plurality of second holes is formed on the substrate, and the conductive film patterns and the insulating film pattern are disposed on a surface of the second hole.

4. The semiconductor package structure of claim 2, wherein the conductive film pattern and the insulating film pattern are disposed on a side wall of the substrate.

5. The semiconductor package structure of claim 1, wherein a plurality of second holes is formed on the substrate, the conductive patterns comprise a plurality of conductive bars, the conductive bars are disposed in the second holes, and the insulators are connected between the semiconductor die and the substrate, and between the substrate and the conductive bars, respectively.

6. The semiconductor package structure of claim 5, wherein the conductive patterns comprises a plurality of conductive film patterns, the conductive film patterns are disposed on a top surfaces and a bottom surfaces of the conductive bars.

7. The semiconductor package structure of claim 1, wherein a thickness of the semiconductor die is approximately equal to a thickness of the substrate.

8. The semiconductor package structure of claim 1, wherein the thermally conductive film is electrically connected to one of the conductive patterns.

9. The semiconductor package structure of claim 1, wherein a material of the insulator is polyimide, solder resist, or permanent photoresist.

10. The semiconductor package structure of claim 1, wherein a metal reflective layer is disposed on the side wall of the first hole.

11. A manufacturing method of a semiconductor package structure, comprising the steps of:
    (a) providing a substrate, wherein the substrate is substantially comprised of a conductive material or a semiconducting material, a first hole is formed on the substrate, and the first hole is passed all the way through the substrate;
    (b) disposing a semiconductor die in the first hole;
    (c) coating an insulator between the semiconductor die and the substrate;
    (d) disposing a plurality of conductive patterns, and the conductive patterns not electrically connecting to each other;
    (e) disposing a thermally conductive film on the bottom of the semiconductor die; and (f) electrically connecting the semiconductor die and the conductive patterns;

wherein the thermally conductive film has a protruding center region disposed under a bottom portion of the semiconductor die and a plurality of bending up end corners.

12. The manufacturing method of the semiconductor package structure of claim 11, wherein the substrate further comprises a plurality of second holes, before the step (b), the manufacturing method further comprises a step of disposing a plurality of insulating film patterns on the surface of the substrate and on the surface of the second hole, and in the step (d), the conductive patterns are a plurality of conductive film patterns, and the conductive film patterns are disposed on the insulating film patterns.

13. The manufacturing method of the semiconductor package structure of claim 12, wherein the conductive film patterns and the thermally conductive film are formed at the same time.

14. The manufacturing method of the semiconductor package structure of claim 12, wherein before the step (b), the manufacturing method further comprises the step of disposing a plurality of insulating film patterns on the top surface, the bottom surface, and the side walls of the substrate, and in the step (d), the conductive patterns are a plurality of conductive film patterns, and the conductive film patterns are disposed on the insulating film patterns.

15. The manufacturing method of the semiconductor package structure of claim 11, wherein the substrate comprises a plurality of second holes and a plurality of conductive bars, and in the step (d), the conductive bars are disposed in the second holes to form the conductive patterns.

16. The manufacturing method of the semiconductor package structure of claim 15, wherein the thicknesses of the conductive bars are approximately equal to the depths of the second holes.

17. The manufacturing method of the semiconductor package structure of claim 15, further comprising the step of forming a plurality of conductive film patterns on the conductive bars.

18. The manufacturing method of the semiconductor package structure of claim 11, further comprising the step of forming a metal reflective layer on the side wall of the first hole.

19. The manufacturing method of the semiconductor package structure of claim 11, wherein the thickness of the semiconductor die is approximately equal to the depth of the first hole.

20. The manufacturing method of the semiconductor package structure of claim 11, wherein before the step (b), the manufacturing method comprises the step of reversing or flipping over the substrate to make the bottom of the substrate facing up, and between the step (e) and the step (f), the manufacturing method comprises the step of reversing or flipping over the substrate again to make the bottom of the substrate facing down.

* * * * *